United States Patent [19]

Vulih et al.

[11] Patent Number: 6,002,277

[45] Date of Patent: Dec. 14, 1999

[54] SAMPLE-AND-HOLD CIRCUIT HAVING REDUCED PARASITIC DIODE EFFECTS AND RELATED METHODS

[75] Inventors: Salomon Vulih, Neshamic Station; Donald R. Preslar, Somerville, both of N.J.; Thomas A. Jochum, Durham, N.C.

[73] Assignee: Intersil Corporation, Palm Bay, Fla.

[21] Appl. No.: 09/055,561

[22] Filed: Apr. 6, 1998

[51] Int. Cl.⁶ .............................. H03K 17/00; G11C 27/02
[52] U.S. Cl. .................................. 327/94; 327/95; 327/96
[58] Field of Search ................................ 327/91, 93, 94, 327/95, 96; 341/122, 123, 124, 125

[56] References Cited

U.S. PATENT DOCUMENTS

| | | | |
|---|---|---|---|
| 4,308,468 | 12/1981 | Olson | 327/94 |
| 4,667,178 | 5/1987 | Ryu | 340/347 |
| 4,862,016 | 8/1989 | Genrich | 327/94 |
| 4,935,702 | 6/1990 | Mead et al. | 330/9 |
| 5,142,238 | 8/1992 | White | 330/9 |
| 5,180,965 | 1/1993 | Nose | 323/375 |
| 5,243,235 | 9/1993 | Wakayama et al. | 327/494 |
| 5,258,664 | 11/1993 | White | 327/91 |
| 5,286,663 | 2/1994 | Manning | 437/41 |
| 5,481,212 | 1/1996 | Shima | 327/94 |
| 5,546,022 | 8/1996 | D'Souza et al. | 326/87 |
| 5,583,821 | 12/1996 | Rose et al. | 365/226 |
| 5,593,907 | 1/1997 | Anjum et al. | 437/35 |
| 5,594,265 | 1/1997 | Shimizu et al. | 257/355 |
| 5,663,586 | 9/1997 | Lin | 257/336 |
| 5,696,396 | 12/1997 | Tokura et al. | 257/341 |

*Primary Examiner*—Timothy P. Callahan
*Assistant Examiner*—An T. Luu
*Attorney, Agent, or Firm*—Allen, Dyer, Doppelt, Milbrath & Gilchrist, P.A.

[57] ABSTRACT

An integrated S/H circuit includes a first field-effect transistor (FET) formed on a substrate with a sampling capacitor, and a buffer amplifier having an input connected to the sampling capacitor and an output connectable to the body of the first FET. The buffer amplifier thereby reduces undesired effects from a parasitic diode formed by the body and sampling capacitor. More particularly, the first FET preferably has a first conduction terminal for receiving the input signal, a second conduction terminal connected to the sampling capacitor, and a control terminal responsive to control signals for connecting the input signal to the sampling capacitor during a sampling time, and for disconnecting the input signal from the sampling capacitor during a holding time. The circuit may include one or more switches for connecting the body of the first FET to the output of the buffer amplifier during the holding time to thereby apply a holding voltage from the sampling capacitor to the body of the first FET. The holding voltage overcomes the voltage droop as would otherwise be caused by the parasitic diode. The switches may also connect the body of the first FET to a supply voltage during the sampling time. In addition, the buffer amplifier may have a substantially unity gain.

26 Claims, 4 Drawing Sheets

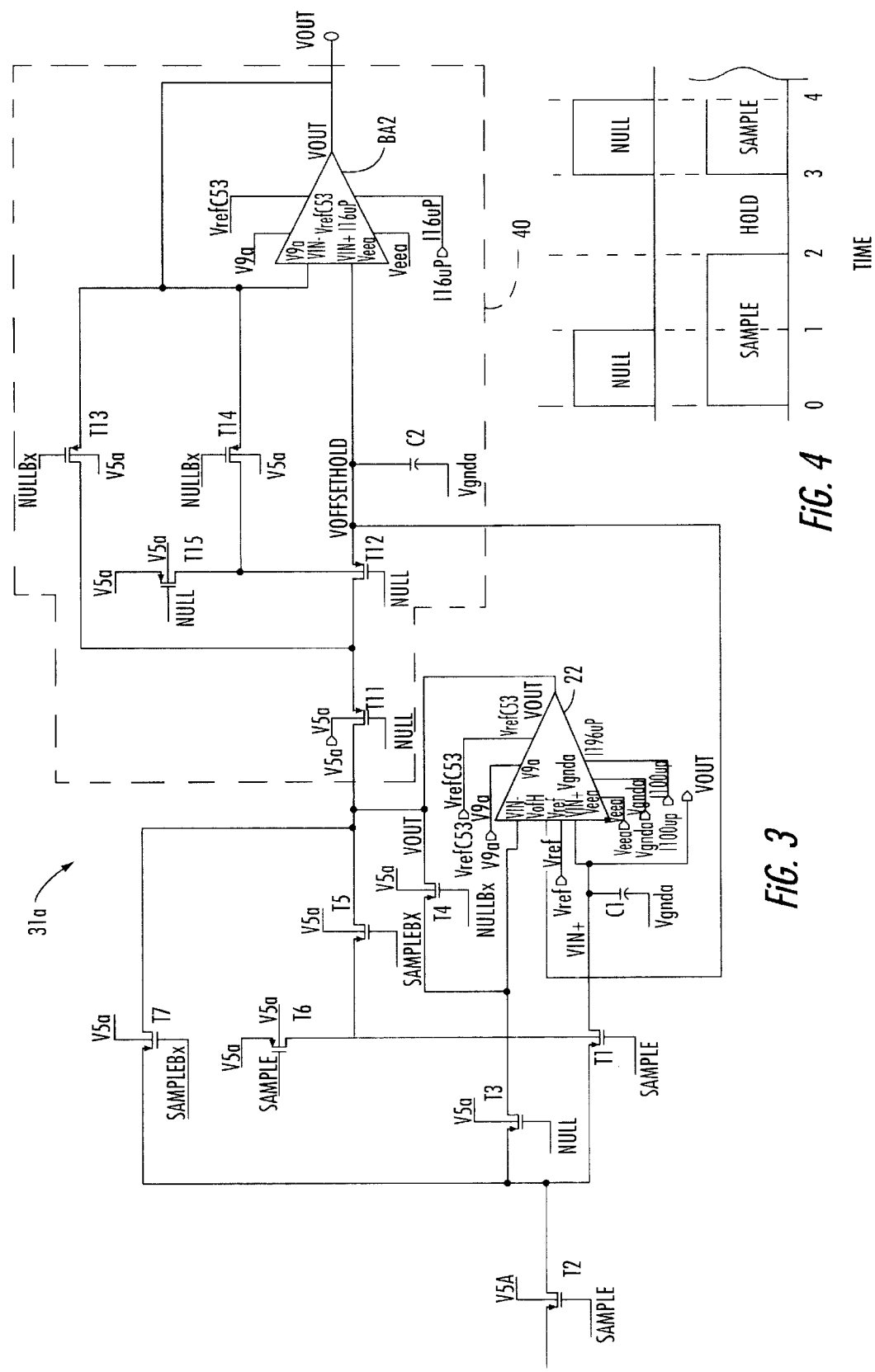

SAMPLE-AND-HOLD CIRCUIT HAVING REDUCED PARASITIC DIODE EFFECTS AND RELATED METHODS

FIELD OF THE INVENTION

The present invention relates to electronic circuits, and more particularly, to a sample-and-hold circuit and related methods.

BACKGROUND OF THE INVENTION

Sample-and-hold (S/H) circuits are widely used, for example, to store an analog voltage signal accurately over a time period ranging typically from as little as a few microseconds to as long as several minutes. A S/H circuit may be considered as a switched capacitor network, wherein the input signal is sampled to a sampling capacitor during a sampling time, and is held on the capacitor during the holding time. Since the analog voltage across the sampling capacitor in the hold time should be available at the output terminal of the circuit even under low impedance, an output buffer amplifier is typically connected to the sampling capacitor.

The main desired characteristics of a S/H circuit may be a low hold mode voltage droop, short settling time in the acquisition or sampling mode, a low offset voltage, and hold-mode feedthrough. The hold mode droop is dependent on the leakage current from the sampling capacitor to the various components connected thereto.

In one type of S/H circuit a transmission gate in the form of a field-effect transistor (FET) samples the input voltage onto the sampling capacitor. An output amplifier reads the voltage from the sampling capacitor. The sampling capacitor may also be formed in the same semiconductor substrate as the FET. Accordingly, a parasitic diode may be formed by the body of the FET and the sampling capacitor. The parasitic diode may cause voltage droop or an inaccurate voltage for the output of the S/H circuit.

SUMMARY OF THE INVENTION

In view of the foregoing background, it is therefore an object of the present invention to provide an integrated S/H circuit which has reduced voltage droop, as may be caused by a parasitic diode, and especially for relatively long holding times.

This and other objects, features and advantages in accordance with the present invention are provided by an integrated S/H circuit comprising a first field-effect transistor (FET) formed on a substrate with the sampling capacitor, and a buffer amplifier having an input connected to the sampling capacitor and an output connectable to the body of the first FET to thereby reduce undesired effects from the parasitic diode formed by the body and sampling capacitor. More particularly, the first FET preferably has a first conduction terminal for receiving the input signal, a second conduction terminal connected to the sampling capacitor, and a control terminal responsive to control signals for connecting the input signal to the sampling capacitor during a sampling time, and for disconnecting the input signal from the sampling capacitor during a holding time.

The circuit may further comprise switching means for connecting the body of the first FET to the output of the buffer amplifier during the holding time to thereby apply a holding voltage from the sampling capacitor to the body of the first FET. The holding voltage overcomes the voltage droop as would otherwise be caused by the parasitic diode.

The switching means may further include means for connecting the body of the first FET to a supply voltage during a sampling time. In addition, the buffer amplifier preferably has a substantially unity gain.

The buffer amplifier may have an inverting input, a non-inverting input, and an output. In one embodiment, the output of the amplifier is connectable to the inverting input, and the sampling capacitor is connected to the non-inverting input. The buffer amplifier also preferably comprises an FET input stage. The input circuit may also include a second FET connected in series with the first FET. An output amplifier may be connected to the sampling capacitor for generating an output signal based upon the holding voltage on the sampling capacitor.

A method aspect of the invention is for enhancing operation of an integrated S/H circuit for an input signal. The S/H circuit may be of a type comprising a sampling capacitor, a first FET having a first conduction terminal for receiving the input signal, a second conduction terminal connected to the sampling capacitor, and a control terminal responsive to control signals for connecting the input signal to the sampling capacitor during a sampling time and for disconnecting the input signal from first sampling capacitor during a holding time. The first FET also includes a body which creates a parasitic diode connected to the sampling capacitor. Accordingly, the method preferably comprises the steps of providing a buffer amplifier having an input connected to the sampling capacitor and an output, and connecting the output of the buffer amplifier to the body of the first FET to thereby reduce undesired effects from the parasitic diode. The method may further include the step of connecting the body of the first FET to a supply voltage when in the sampling mode, and the buffer amplifier may be a unity gain buffer amplifier.

BRIEF DESCRIPTION OF THE DRAWINGS

FIG. 3 is a schematic circuit diagram of the first S/H circuit as shown in FIG. 1.

FIG. 4 is a simplified timing diagram for the sample and null signals used in the S/H circuit as shown in FIG. 3.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
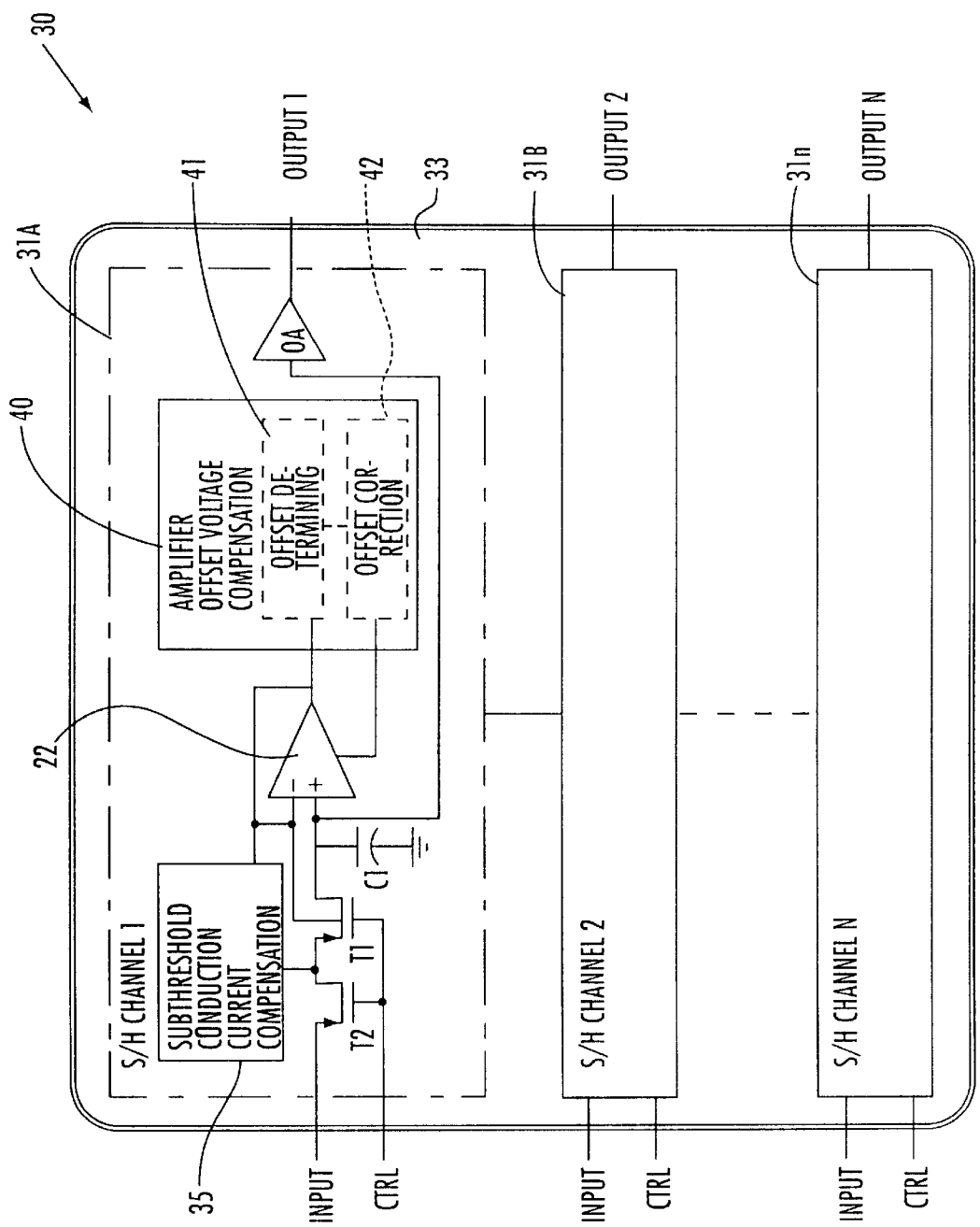
FIG. 1 is a schematic block diagram of an S/H integrated circuit device in accordance with the present invention and with a first S/H circuit portion shown in greater detail.
Figure 2:
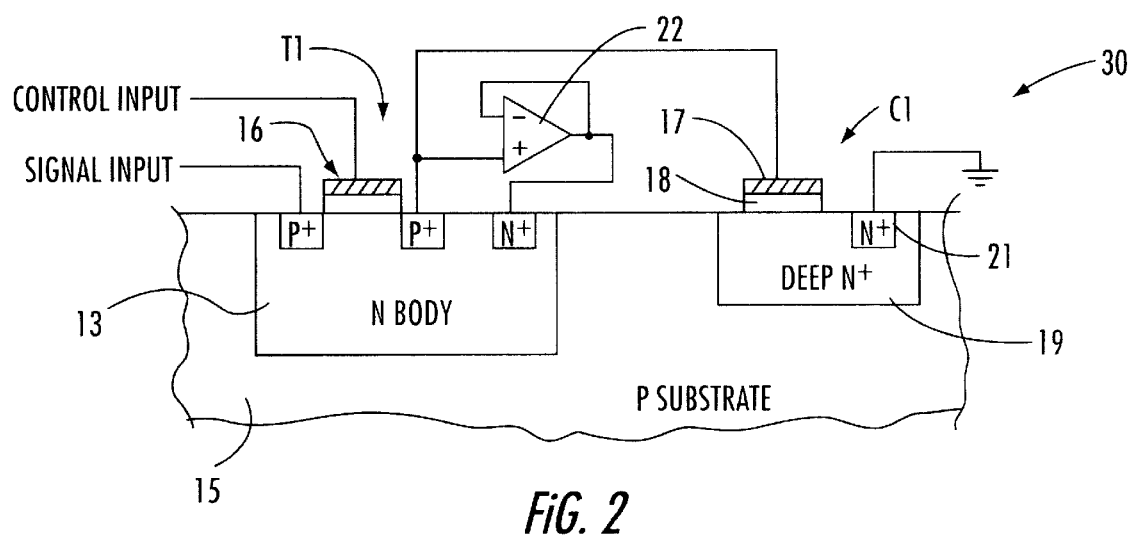
FIG. 2 is a cross-sectional and partially schematic diagram of a portion of the S/H circuit in accordance with the present invention.

Referring initially to FIGS. 1 and 2, an integrated circuit 30 according to the invention is now explained. The circuit 30 includes a plurality of individual S/H circuits 31a–31n for respective channels 1–N, and which are formed on a semiconductor substrate 33 as will be readily appreciated by those skilled in the art. The functional components of the first S/H circuit 31a are shown in greater detail, it being understood that the other S/H circuits 31b–31n include similar components. As will also be readily appreciated by those skilled in the art, the integrated S/H circuit as described further herein may be an individual circuit, or may also be combined with multiple such circuits, and/or other circuit components on the same substrate.

An output amplifier OA is connected to the sampling capacitor C1 to provide an output as will be readily appreciated by those skilled in the art. The illustrated integrated S/H circuit 31a also includes a pair of first and second FETs T1, T2 being connected in series, and to the sampling capacitor C1. The first and second FETs T1, T2 are controlled by control signals, to sample the input voltage to the sampling capacitor C1. A unity gain buffer amplifier 22 is connected between the body/well of the first FET T1 and the sampling capacitor C1 to thereby prevent the parasitic diode from affecting the charge on the capacitor during the holding time.

More particularly, as shown in FIG. 2, for a combination bipolar and complementary metal oxide semiconductor (BiCMOS) process, the first transmission gate or FET T1 is controlled to periodically sample the input voltage onto the sampling capacitor C1. The transistor T1 includes an N conductivity type body 13 formed in the P conductivity type substrate 15. The P+ doped regions provide the source and drain for the transistor T1. The gate 16 is controlled to sample the signal onto the sampling capacitor C1. The sampling capacitor C1, in turn, includes the deep N+ type region 19 formed in the substrate 15, and the conductive layer 17 on the dielectric layer 18. The N+ region 19 is illustratively coupled to ground by the N+ contact region 21.

To sample the voltage, the first transistor T1 is switched to a conductive state. Unfortunately, a problem occurs in that a parasitic diode is formed between the terminal which is connected to the sampling capacitor C1 and the background body/well 13. This parasitic diode is connected to the sampling capacitor C1 and would otherwise cause the capacitor to discharge or charge to the well potential when in the hold mode. In accordance with one advantageous aspect of the present invention, the problem of the parasitic diode is overcome by connecting the body/well 13 of the first switching MOS transistor T1 to a voltage equal to the voltage of the sampling capacitor C1. This may be accomplished as illustrated by connecting the sampling capacitor C1 to a unity gain buffer amplifier 22. The output of the unity gain buffer amplifier 22 is fed to the body/well 13 of the first switching MOS transistor T1. Accordingly, the buffer amplifier 22 removes the undesired effects of the parasitic diode as will be readily appreciated by those skilled in the art.

One possible disadvantage of the unity gain buffer amplifier 22 is that it may have a direct current (D.C.) offset, and this offset can be large considering that the buffer amplifier typically has a MOS transistor input stage. In addition, the first transistor T1 may also have a tendency to charge or discharge the sampling capacitor C1 based upon a subthreshold conduction current. These difficulties may become pronounced for a S/H circuit which desirably has a relatively long holding time, such as, for example, several seconds. During such a long holding time, voltage droop may reduce the accuracy of the sampled value.

Another advantageous aspect of the present invention is the provision of the illustrated subthreshold conduction current compensation means or circuit 35 connected to the node between the first and second transistors T1, T2. The subthreshold conduction current compensation means 35 is for reducing undesired effects of subthreshold conduction current in the first FET T1 during the holding time. As shown in the illustrated embodiment, the subthreshold current conduction compensation means 35 preferably causes a voltage at a first conduction terminal of the first FET T1 at the node between the two transistors, to be substantially equal to a voltage at the second conduction terminal of the first FET during the holding time. The second conduction terminal of the first FET T1 is connected to the sampling capacitor C1.

As shown in the illustrated embodiment, the subthreshold conduction current compensation means 35 may connect the holding voltage from the output of the first buffer amplifier 22 to the node defined between a second conduction terminal of the second FET T2 and the first conduction terminal of the first FET T1 during the holding time. The first conduction terminal of the second transistor T2 is illustratively connected to eceive the input signals. In addition, because both transistors T1, T2 are of the same conductivity type, a common control signal may operate the gates of the transistors T1, T2 as will be readily appreciated by those skilled in the art.

Another aspect of the invention relates to overcoming the difficulties that may be caused by the D.C. offset of the buffer amplifier 22, particularly for relatively long holding times on the order of several seconds, for example. The S/H circuit 31a includes amplifier offset compensation means or circuit 40 for compensating for the D.C. offset of the first buffer amplifier 22. Of course, the amplifier offset voltage compensation and the subthreshold conduction current compensation may be used together or individually, as will be readily appreciated by those skilled in the art.

The amplifier offset compensation means 40 may comprise as shown in the illustrated embodiment, offset determining means or circuit 41 for determining an offset voltage generated by the first buffer amplifier 22 and offset correction means or circuit 42 for generating an offset correction signal responsive to the offset determining means and coupling the offset correction signal to the first buffer amplifier.

The first buffer amplifier 22 may comprise a pair of inputs, that is, inverting (−) and non-inverting (+) inputs. Accordingly, as will be described in greater detail below with reference to the schematic circuit and timing diagrams of FIGS. 3 to 5, the offset determining means 41 may comprise means for connecting the pair of inputs to the sample voltage when determining the offset error. The offset determining means 41 may preferably comprise storing means for storing the offset voltage of the first buffer amplifier 22, and the storage means may be provided by a second S/H circuit including a second sampling capacitor and a second buffer amplifier as will also be described in greater detail below.

The offset correction means 42, as will be explained in greater detail below, may further comprise a differential amplifier having a first input connected to the second sampling capacitor, a second input connected to a reference voltage, and a pair of differential outputs connected to the first buffer amplifier 22. In addition, the amplifier offset compensation means 40 may include null sample means for sampling the offset voltage during a null time which is relatively brief, such as, for example, less than about 10 microseconds.

Turning now additionally to FIGS. 3 and 4, further details of the S/H circuit 31a in accordance with the invention are explained. The first two transistors T1, T2 gate the input signal to the sampling capacitor C1 during a sampling time which is held for two schematically illustrated clock periods as shown in FIG. 4. During a first part of the sampling time, that is, during the null time, the offset voltage of the buffer amplifier 22 is determined. More particularly, transistor T3 connects the inverting input of the buffer amplifier 22 to the input voltage, while transistors T1, T2 are also driving the non-inverting input with the input voltage. Transistors T11, T12 also gate the output of the first buffer amplifier 22 to the second capacitor C2 which, in turn, is connected to the non-inverting input of the second amplifier BA2. he body of the transistor T12 is connected to the upply during the null period by transistor T15, and the node between transistors T11, T12 is connected to the output of the second amplifier BA2 by the transistor T13. During the null period, the offset correction voltage is stored on the second sampling capacitor C2 to serve as the correction input for the first amplifier 22.

During the second part of the sample time, and after the null period, the output of the first buffer amplifier 22 is fed back to the inverting input by the transistor T4. Transistors T3, T11, and T12 also turn off, and transistors T4, T13, and T14 are turned on and remain on even during the holding period. Also, during the holding period, transistors T1, T2, T6 are off, and transistors T7, T5 are on as will be readily appreciated by those skilled in the art. Of course, during the hold time, the voltage on the sampling capacitor C1 may be read as would also be readily appreciated by those skilled in the art. As would also be readily understood by those skilled in the art, positive or negative logic may be used in the S/H circuit 31a.

Figure 5:
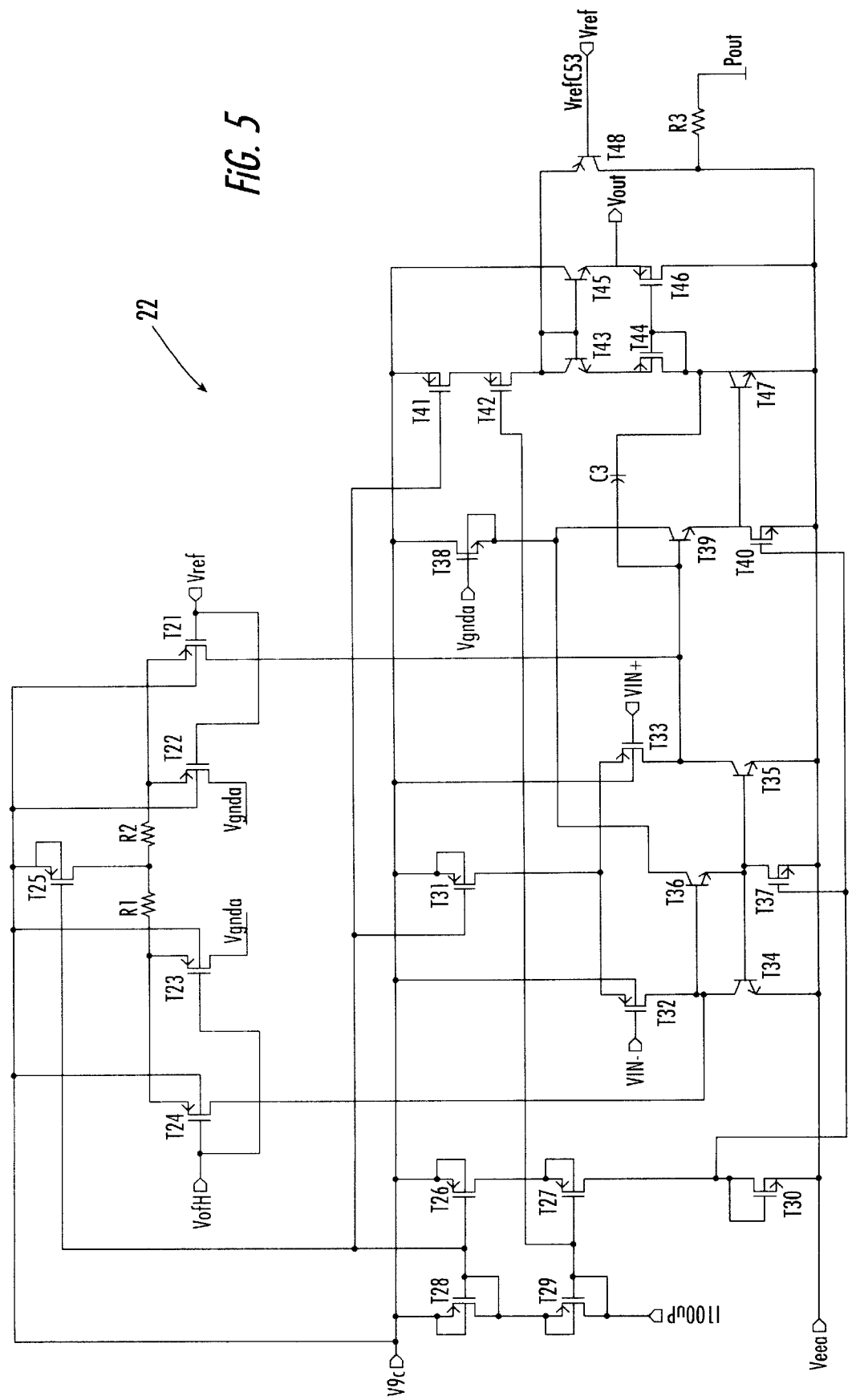
FIG. 5 is a schematic circuit diagram of the first buffer amplifier as shown in FIG. 3.

Turning now more particularly to FIG. 5, an embodiment of the buffer amplifier 22 is further described. As will be readily appreciated by those skilled in the art, the amplifier 22 is very similar to a 741 amplifier, but with two parallel input sections. It is preferably a high frequency amplifier (10 MHZ) with a typical gain of 80 dB.

The amplifier 22 may be considered as comprising the following five sections which are also described in greater detail below:

1. The bias section which is formed by devices T29, T28, T26, T27, T30, T40, T37, T41, T42 and T25.

2. A first front end section formed by devices T32, T33, T34, T35, T36, T39 and T47.

3. A second front end section formed by devices T24, T23, T22, and T21, and resistors R1 and R2.

4. An output section formed by devices T43, T44, T45 and T46.

5. A clamp section formed by device T48.

The amplifier 22 has two power rails. The positive supply is V9a, the negative supply is Veea, and current bias is provided at pin I100µP. For the illustrated embodiment, a +9 V positive supply and −5 V negative supply may be used with a bias current of 100 µAmp pulling to Veea. Resistor R3 may only need be used for computer simulations to connect Veea to the P substrate of the chip.

1. Bias Section.

A bias current of 100 µAmps is provided at pin I100µP. This current is a pull down current to Veea. The bias current is applied to two diode-connected PMOS devices T28 and T29, which then become the master in the current mirrors. This current is then mirrored to:

two PMOS devices T26 and T27, in turn, connected to a second diode-connected MOS device T30 which, in turn, becomes a master diode itself and is connected to T37 and T40 to provide pull down current for the input section of the amplifier;

T31 which provides the tail current of the first (main) input differential amplifier;

T41 and T42 which provide the bias current for the output stage; and

T25 which provides the tail current for the second (feedback) input differential amplifier.

2. First Input Section.

The first input section is formed by two input PMOS devices T32 and T33 that form the input differential pair. Two NPN devices T34 and T35 form the load for the input pair. An NPN device T36 provides the base current for the load devices T34 and T35. An NMOS device T37 functions as a pull down device to the bases of the load devices, to improve speed. Two NPN devices T39 and T47 load the right side of the input differential pair, matching T36 and T35 in the left side of the differential amplifier, with the NMOS device T40 also matching device T37 of the input differential pair. Device T47 is connected in a common emitter configuration so it also provides gain to the amplifier.

Capacitor C3 is used to provide frequency compensation to render the amplifier unity gain stable. An NMOS device T38 provides a pull up path for the devices T39 and T36 to the positive supply. Normally this is not necessary, but due to technology limitations of the NPN bipolar device, the NMOS device is used to make up for the voltage drop.

3. Second Input Section.

The input pair is formed by two PMOS devices T21 and T24. Two additional PMOS devices T22 and T23 are connected in parallel with the input devices T21 and T24 to reduce the gain of this stage. Two resistors R1 and R2 are added to improve the matching and also reduce the gain. Device T25 of the bias circuit operates at a higher current level to make matching of the differential pair dependent more on the matching of the resistors than the MOS devices.

4. Output Section.

This section is a class AB output stage. A diode-connected NMOS device T44 is connected in series with an NPN bipolar device T43, with T47's collector providing the input signal. Devices T41 and T42 provide the bias current to this section. The current through devices T43 and T44 is mirrored to the actual output, NPN device T45 and PMOS device T46, which then connect to Vout, the output of the amplifier.

5. Clamp Section.

To avoid the output voltage from going above a set voltage, in this case set by VrefC53, a PNP bipolar device T48 is included in the circuit. This keeps the output Vout from going above a set output level.

Considering now the general operation of the amplifier 22, when the input voltages, VIN− and VIN+ are connected to the same voltage level, and external switches are closed, the amplifier is put into a non-inverting unity gain configuration around the second input section of the amplifier. This causes the null capacitor to store the reference level plus the offset of the amplifier. During operation, the unity gain feedback path around the second input section of the amplifier is opened, with the null capacitor having stored the reference voltage plus the offset. This in effect cancels the offset of the amplifier.

During operation, the other two inputs of the amplifier, VIN− and VIN+, are disconnected from a common voltage and connected into unity gain configuration around the main (first) input stage of the amplifier. The input signal is then applied to VIN+, the non-inverting input node. The null capacitor is always hard wired to the VofH of the second input stage.

One method aspect of the invention is for enhancing operation of an integrated S/H circuit 31a for an input signal. The S/H circuit 31a is preferably of a type comprising a first sampling capacitor C1, and a first field-effect transistor (FET) T1 having a first conduction terminal for receiving the input signal, a second conduction terminal connected to the first sampling capacitor, and a control terminal responsive to control signals for connecting the input signal to the first sampling capacitor during a sampling time and for disconnecting the input signal from the first sampling capacitor during a holding time. The S/H circuit 31a may further include a first buffer amplifier 22 having an input connected to the first sampling capacitor C1 and an output connected to the body of the first FET T1 during the holding time for applying a holding voltage from the first sampling capacitor to a body of the first FET.

Unfortunately, as described herein, the first buffer amplifier 22 may have a D.C. offset. Accordingly, the method preferably comprises the step of compensating for the D.C. offset of the first buffer amplifier 22. The compensating step may comprise determining an offset voltage generated by the first buffer amplifier 22, and generating an offset correction signal responsive to the offset determining means and coupling the offset correction signal to the first buffer amplifier.

Another aspect of the invention addresses the subthreshold conduction current of the first FET T1. In other words, the method preferably further includes the step of reducing undesired effects of subthreshold onduction current, such as by causing a voltage at the irst conduction terminal of the first FET T1 to be ubstantially equal to a voltage at the second onduction terminal of the first FET during the holding time. For an embodiment wherein the S/H circuit 31a further comprises a second FET T2 having a first conduction terminal connected to the input signal, and a second conduction terminal connected to the first conduction terminal of the first FET, the step of compensating for the subthreshold conduction current preferably comprises connecting the holding voltage from the output of the first buffer amplifier 22 to a node defined between the second conduction terminal of the second FET and the first conduction terminal of the first FET during the holding time.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated sample-and-hold (S/H) circuit for an input signal and comprising:
   a substrate;
   a sampling capacitor formed on said substrate;
   a first field-effect transistor (FET) formed on said substrate and having a first conduction terminal for receiving the input signal, a second conduction terminal connected to said sampling capacitor, and a control terminal responsive to control signals for connecting the input signal to said sampling capacitor during a sampling time and for disconnecting the input signal from said sampling capacitor during a holding time, said first FET further comprising a body creating a parasitic diode connected to said sampling capacitor; and
   a buffer amplifier having an input connected to said sampling capacitor and an output for switchably connecting to the body of said first FET to thereby reduce undesired effects from the parasitic diode.

2. An integrated S/H circuit according to claim 1 further comprising switching means for connecting the body of said first FET to the output of said buffer amplifier during the holding time to apply a holding voltage from said sampling capacitor to the body of said first FET.

3. An integrated S/H circuit according to claim 2 wherein said switching means further comprises means for connecting the body of said first FET to a supply voltage during a sampling time.

4. An integrated S/H circuit according to claim 1 wherein said buffer amplifier has an unity gain.

5. An integrated S/H circuit according to claim 1 wherein said buffer amplifier has an inverting input and a non-inverting input and an output.

6. An integrated S/H circuit according to claim 5 wherein the output of said buffer amplifier is connectable to the inverting input; and wherein said sampling capacitor is connected to said non-inverting input.

7. An integrated S/H circuit according to claim 1 wherein said buffer amplifier comprises an FET input stage.

8. An integrated S/H circuit according to claim 1 further comprising a second FET connected in series with said first FET.

9. An integrated S/H circuit according to claim 1 further comprising a second amplifier connected to said sampling capacitor for generating an output signal based upon the holding voltage on said sampling capacitor.

10. An integrated sample-and-hold (S/H) circuit for an input signal and comprising:
    a substrate;
    a sampling capacitor formed on said substrate;
    a first field-effect transistor (FET) formed on said substrate and having a first conduction terminal for receiving the input signal, a second conduction terminal connected to said sampling capacitor, and a control terminal responsive to control signals for connecting the input signal to said sampling capacitor during a sampling time and for disconnecting the input signal from said sampling capacitor during a holding time, said first FET further comprising a body creating a parasitic diode connected to said sampling capacitor;
    a buffer amplifier comprising an FET input stage having an input connected to said sampling capacitor, said buffer amplifier further having an output; and
    switching means for connecting the body of said first FET to the output of said buffer amplifier during the holding time to apply a holding voltage from said sampling capacitor to the body of said first FET to thereby reduce undesired effects from the parasitic diode.

11. An integrated S/H circuit according to claim 10 wherein said switching means further comprises means for connecting the body of said first FET to a supply voltage during a sampling time.

12. An integrated S/H circuit according to claim 10 wherein said buffer amplifier has an unity gain.

13. An integrated S/H circuit according to claim 10 wherein said buffer amplifier has an inverting input and a non-inverting input and an output.

14. An integrated S/H circuit according to claim 13 wherein the output of said buffer amplifier is connectable to the inverting input; and wherein said sampling capacitor is connected to said non-inverting input.

15. An integrated S/H circuit according to claim 10 further comprising a second FET connected in series with said first FET.

16. An integrated S/H circuit according to claim 10 further comprising a second amplifier connected to said sampling capacitor for generating an output signal based upon the holding voltage on said sampling capacitor.

17. An integrated sample-and-hold (S/H) circuit for an input signal and comprising:

a substrate;

a sampling capacitor formed on said substrate;

a first field-effect transistor (FET) formed on said substrate and having a first conduction terminal for receiving the input signal, a second conduction terminal connected to said sampling capacitor, and a body creating a parasitic diode connected to said sampling capacitor; and a buffer amplifier having an input connected to said sampling capacitor and an output for switchably connecting to the body of said first FET to thereby reduce undesired effects from the parasitic diode.

18. An integrated S/H circuit according to claim 17 further comprising switching means for connecting the body of said first FET to the output of said buffer amplifier during a holding time to apply a holding voltage from said sampling capacitor to the body of said first FET.

19. An integrated S/H circuit according to claim 18 wherein said switching means further comprises means for connecting the body of said first FET to a supply voltage during a sampling time.

20. An integrated S/H circuit according to claim 17 wherein said buffer amplifier has an unity gain.

21. An integrated S/H circuit according to claim 17 wherein said buffer amplifier comprises an FET input stage.

22. An integrated S/H circuit according to claim 17 further comprising a second FET connected in series with said first FET.

23. An integrated S/H circuit according to claim 17 further comprising a second amplifier connected to said sampling capacitor for generating an output signal based upon the holding voltage on said sampling capacitor.

24. A method for enhancing operation of an integrated sample-and-hold (S/H) circuit for an input signal, the S/H circuit of a type comprising a sampling capacitor, a first field-effect transistor (FET) having a first conduction terminal for receiving the input signal, a second conduction terminal connected to the sampling capacitor, and a control terminal responsive to control signals for connecting the input signal to the sampling capacitor during a sampling time and for disconnecting the input signal from first sampling capacitor during a holding time, the first FET further comprising a body creating a parasitic diode connected to the sampling capacitor, the method comprising the steps of:

providing a buffer amplifier having an input connected to the sampling capacitor and an output; and connecting the output of the buffer amplifier to the body of the first FET during the holding time to thereby reduce undesired effects from the parasitic diode.

25. A method according to claim 24 further comprising the step of connecting the body of the first FET to a supply voltage when in the sampling mode.

26. A method according to claim 24 wherein the buffer amplifier has an unity gain.

* * * * *

UNITED STATES PATENT AND TRADEMARK OFFICE
CERTIFICATE OF CORRECTION

PATENT NO. : 6,002,277
DATED : December 14, 2000
INVENTOR(S) : Salomon Vulih, et. al.

It is certified that error appears in the above-identified patent and that said Letters Patent is hereby corrected as shown below:

Column 4, Line 20    Srtike: "eceive"
Insert: --receive--

Column 7, line 28    Strike: "onduction"
Insert: --conduction--

Column 7, line 29    Strike: "irst"
Insert: --first--

Column 7, line 30    Strike: "ubstantially"
Insert: --substantially--

Column 7, line 31    Strike: "onduction"
Insert: --conduction--

Signed and Sealed this

Twenty-fifth Day of July, 2000

Attest:

Attesting Officer

Q. TODD DICKINSON

Director of Patents and Trademarks